United States Patent [19]

Ichikawa

[11] Patent Number: 4,491,980

[45] Date of Patent: Jan. 1, 1985

[54] HEARING AID COUPLED WITH A RADIO

[75] Inventor: Teruo Ichikawa, Izumi, Japan

[73] Assignee: Minolta Camera Kabushiki Kaisha, Osaka, Japan

[21] Appl. No.: 515,599

[22] Filed: Jul. 21, 1983

[30] Foreign Application Priority Data

Jul. 26, 1982 [JP] Japan .................................. 57-130696

[51] Int. Cl.³ ........................ H04B 1/06; H04R 27/00
[52] U.S. Cl. ................... 455/344; 179/107 R; 381/107
[58] Field of Search ............... 455/344, 351; 434/112, 434/116; 179/107 R; 381/57, 80, 107, 108, 119

[56] References Cited

U.S. PATENT DOCUMENTS

| | | | |
|---|---|---|---|
| 2,766,378 | 10/1966 | Sundin et al. | 381/110 |
| 3,518,375 | 6/1970 | Hawkins | 381/80 |
| 3,992,584 | 11/1976 | Dugan | 381/107 |
| 4,352,088 | 9/1982 | Isunoda | 381/107 |

FOREIGN PATENT DOCUMENTS

| | | | |
|---|---|---|---|
| 2510731 | 9/1976 | Fed. Rep. of Germany | 179/107 R |
| 1565701 | 4/1980 | United Kingdom | 179/107 R |
| 0596238 | 3/1978 | U.S.S.R. | 179/107 R |

Primary Examiner—Marc E. Bookbinder
Attorney, Agent, or Firm—Watson, Cole, Grindle & Watson

[57] ABSTRACT

A built in radio/hearing aid comprises a control voltage generator means which generates a control voltage depending on the level of a microphone signal of the hearing aid and a mixing control means which controls the ratio of the mixture of a radio signal from a radio signal generator and the microphone signal from a microphone in accordance with the level of the control voltage. Thus, the level of the radio signals is automatically changed in accordance with the level of circumstantial audio signals within the microphone signal.

7 Claims, 3 Drawing Figures

HEARING AID COUPLED WITH A RADIO

BACKGROUND OF THE INVENTION

1. Field of the Invention

The present invention relates to a hearing aid or acousticon coupled with a radio tuner. More particularly, it relates to a control system for a mixing circuit which mixes two audio signals, one of which is a hearing aid microphone signal continuously generated from the microphone of the hearing aid and the other of which is a radio signal generated from the radio tuner only when the radio is in operation.

2. Description of the Prior Art

A mixing circuit used in conventional audio devices was provided with an adjusting member for each audio signal for manually adjusting the level of the signal such that a desired ratio of the mixture (the ratio of the levels of the signals being mixed) is obtained by the adjustment of the manual members. When a hearing aid is coupled with a radio tuner to enable generation, through a single earphone, of a sound received by the microphone and amplified by the hearing aid and/or a sound produced by the radio tuner, it is necessary to mix the two audio signals such that the user can hear the sound from the microphone of the hearing aid when the radio is in operation because the sound from the microphone is always necessary for the user who is hard of hearing. To this end, one method may be to provide a level adjusting member for each audio signal and to mix the audio signals adjusted respectively as was done in the conventional mixing circuit. However, the provision of the adjusting devices increases the size of the hearing aid and makes the hearing aid cumbersome. Additionally, whenever the level of two audio signals changes e.g. due to an increase of voice level applied to the microphone, the mixture ratio changes and the adjusting device has to be used to adjust the ratio to a desired value. Thus, the above-mentioned hearing aid is inconvenient in requiring frequent adjustment.

SUMMARY OF THE INVENTION

An object of the present invention is to provide a built-in radio/hearing aid wherein the ratio of the mixture of a radio signal and a microphone signal is automatically controlled in accordance with the level of a circumstantial sound condition.

Another object of the present invention is to provide a radio/built-in hearing aid wherein the ratio of the mixture of the two signals is automatically changed in accordance with the level of the microphone signal.

A further object of the present invention is to provide a built-in radio/hearing aid which is compact in size and can be easily operated.

According to the present invention, a built-in radio/hearing aid comprises a control voltage generating circuit which generates a control voltage of a level depending on the level of the microphone signal for the hearing aid and the circuit of the hearing aid is arranged such that the ratio of the mixture of the radio signal and the microphone signal is automatically changed in accordance with the level of the control voltage. For instance, when the level of the sound received by the microphone is low, i.e. when the user is in a circumstance where he or she need not listen through the microphone, the sound of the radio is dominantly generated. On the other hand, when the microphone receives high level sounds, i.e. when the user is in a circumstance where he or she should listen through the microphone, sound received by the microphone is dominantly provided. In this way, a ratio of the levels of the two audio signals are automatically determined in response to the circumstantial condition. Additionally, the hearing aid according to the present invention does not require the manual member for adjusting the ratio of the audio signal levels and will not be large in size.

BRIEF DESCRIPTION OF THE INVENTION

Other objects and advantages of the present invention will become apparent in the following description with reference to the attached drawings wherein.

DETAILED DESCRIPTION OF THE PREFERRED EMBODIMENTS

Figure 1:
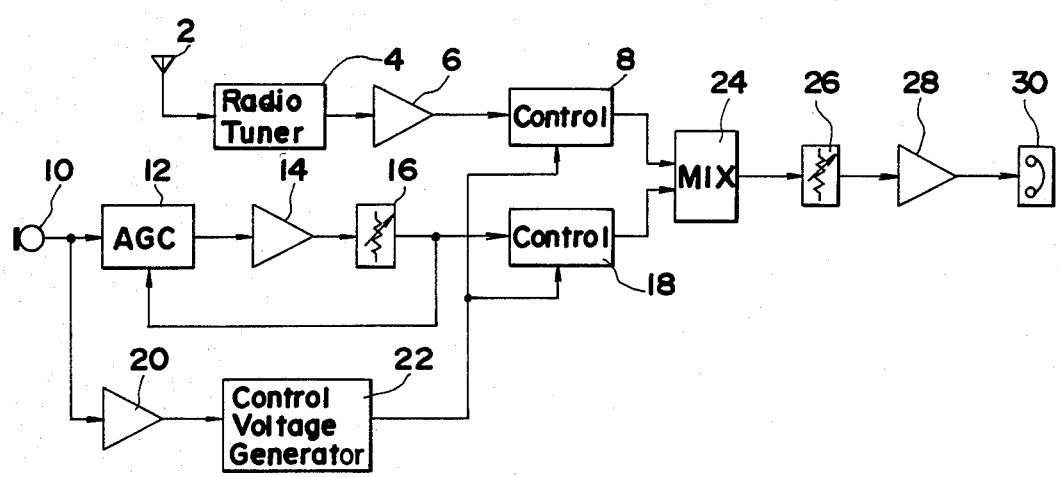
FIG. 1 is a block diagram showing the general construction of a built-in radio/hearing aid according to an embodiment of the present invention.

FIG. 1 is a block diagram showing the general circuit construction of a built-in radio/hearing aid according to an embodiment of the present invention. With reference to that Figure, the circuit composed of antenna 2 and radio tuner 4 is a radio signal receiver portion of a well-known type. The radio signal demodulated by the radio signal receiver portion is applied through amplifier 6 to control circuit 8. The microphone 10 generates microphone signals in response to the sounds received thereby. The microphone signal is applied through automatic gain control circuit 12, amplifier 14 and volume adjuster 16 to control circuit 18 and also through amplifier 20 to control voltage generator circuit 22. Automatic gain control circuit 12 is arranged such that the output signal of volume adjuster 16 is fed back to the control input terminal of automatic gain control circuit 12 to make the latter generate a constant signal level irrespectively of the change in level of the input signal. With this arrangement, the level of the microphone signal applied to control circuit 18 is maintained substantially constant. Control voltage generator circuit 22 generates a voltage signal level corresponding to the signal level of at least the audio range (or band) component of the microphone signal. The voltage signal is applied to respective control input terminals of control circuits 8 and 18 as a control voltage for determining the ratio of the mixture of the audio signals in mixing circuit 24 described below. Control circuit 8 changes the level of the radio signal in response to the level of the control voltage applied thereto from control voltage generator circuit 22 and the radio signal, with the level changed, is applied to one input terminal of mixing circuit 24. In the same way, control circuit 18 changes the level of the microphone signal in response to the level of the control voltage applied thereto from control voltage-generator circuit 22 and the microphone signal, with the level changed, is then applied to the other input terminal of mixing circuit 24. Mixing circuit 24 mixes the two audio signals supplied from control circuits 8 and 18 and combines the signals into a single audio signal. The audio signal composed by mixing circuit 24 is supplied through volume adjuster 26 and amplifier 28 to earphone 30. It is to be understood that volume adjuster 16 is manually operated by the user to adjust, to a desired value, the level of the microphone signal presented through automatic gain control circuit 12. When the user manually operates volume adjuster 16, the mixture ratio of the radio signal and microphone signal is adjusted to a desired value. Volume adjuster 26 can be adjusted manually by the user to adjust to a desired value the level of the signal composed of the radio signal and the microphone signal.

Figure 2:
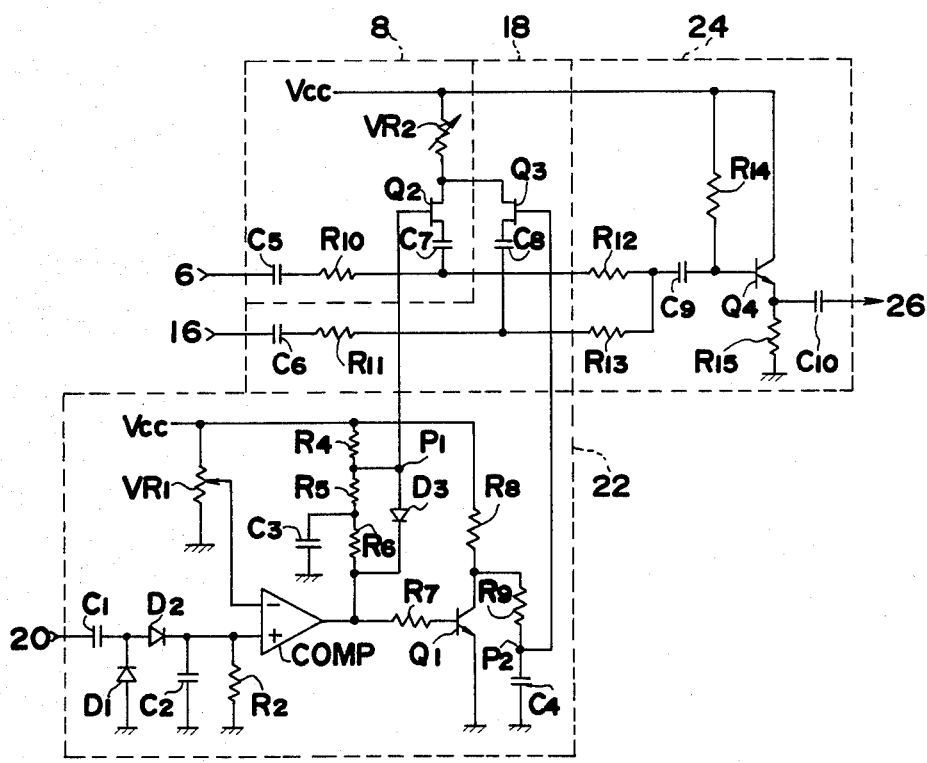
FIG. 2 is a circuit diagram showing an exemplary circuit arrangement of the essential portion of the circuit shown in FIG. 1.

FIG. 2 is a circuit diagram showing an exemplary circuit arrangement of the essential portion of the embodiment shown in FIG. 1, i.e. the circuit portion including control voltage generator circuit 22, control circuits 8 and 18 and mixing circuit 24. In control voltage generator circuit 22, the circuit portion composed of capacitors C1 and C2 and diodes D1 and D2 is a voltage doubler rectifier circuit of a known type which converts AC signals output from the microphone into DC signals. It should be noted that a band pass filter may be provided at the preceeding stage of the rectifier circuit to allow the passage of only the voice range spectral component, thereby obtaining the voice range component signal from the microphone signal. Comparator COMP, potentiometer VR1 and transistor Q1 form a switching circuit which generates a "High" or "Low" level signal in accordance with the level of the microphone signal supplied from the above rectifier circuit. Comparator COMP has its non-inverting input terminal connected with the output terminal of the abovementioned rectifier circuit, its inverting input terminal connected with the slider terminal of potentiometer VR1, and its output connected with the base of transistor Q1. With this circuit arrangement, the output levels of comparator COMP and transistor Q1 will be a "Low" and a "High" level, respectively, when the level of the microphone signal from the rectifier circuit is below the level determined by potentiometer VR1, and will be inverted to a "High" and a "Low" level respectively when the former level is above the latter level. Potentiometer VR1 is adjusted only during assembly of the circuit.

The output terminal of comparator COMP is connected to a first delay circuit of a known type composed of resistance and capacitance elements. The output terminal of transistor Q1 is connected to a second delay circuit also of a known type composed of resistance and capacitance elements. The first delay circuit comprises series-connected resistors R4 and R5 and capacitor C3 and the second delay circuit comprises series-connected resistors R8 and R9 and capacitor C4. Both delay circuits are connected in parallel with the power source Vcc.

The output terminal of comparator COMP is also connected through resistor R6 to the node between resistor R5 and capacitor C3. The collector of transistor Q1 is connected between resistors R8 and R9. Assuming that the capacitances of capacitors C3 and C4 are C3 and C4 and the resistances of resistors R4, R5, R6, R7, R8 and R9 are R4, R5, R6, R7, R8 and R9, the level change of the output of comparator COMP is delayed in accordance with the charging time constant of C3·(R4+R5) or the discharging time constant C3·R6. The output signal of the comparator COMP is applied through the node P1 between resistors R4 and R5 to the gate of FET Q2 described later. Similarly, the level change of the output signal of transistor Q1 is delayed in accordance with the charging time constant of C4·(R8+R9) or discharging time constant of C4·R9.

The output signal is applied through the node P2 between resistor R9 and capacitor C4 to the gate of FET Q3 described later. It should be understood that those time constants are determined to such values, e.g. from 100 milliseconds to several seconds, that control circuits 8 and 18 will not respond to sudden short-time changes of the microphone signal when it occurs.

Variable resistor VR2 is provided as a resistor common to control circuits 8 and 18. Control circuit 8 is composed of series-connected resistor R10, FET Q2, capacitor C7 and variable resistor VR2. Resistor R10 has one end connected with the output terminal of the radio signal receiving section through capacitor C5. Similarly, control circuit 18 is composed of series-connected resistor R11, FET Q3, capacitor C8 and variable resistor VR2. Resistor R11 is connected with the output terminal of volume adjuster 16 through capacitor C6. FETs Q2 and Q3 are provided as variable resistance elements and change the resistance component between their drain and source from infinity to zero in response to the control voltage applied to their gates. Accordingly, the aforementioned series connections serve as a voltage divider circuit for dividing the voltage levels of the radio signal and microphone signal. Mixing circuit 24 comprises an adder circuit including resistors R12 and R13 and transistor Q4 and adds, at a given ratio, the divided voltage level of the radio signal provided by control circuit 8 at the other end terminal of resistor R10, to the divided voltage level of the microphone signal provided by control circuit 18 at the other end terminal of resistor 11.

The operation of the present embodiment, arranged as described above, will be explained hereinafter. When the environment around the user of the hearing aid is quiet and the level of the sound received by the microphone is below a given value corresponding to the signal level determined by potentiometer VR1, the output levels of comparator COMP and transistor Q1 are "Low" and "High" respectively. Hence, a "Low" level control voltage is applied to the gate of FET Q2 of control circuit 8 while a "High" level control voltage is applied to the gate of FET Q3 of control circuit 18, so that the drain-source resistances of FETs Q2 and Q3 are infinity and zero respectively. Accordingly, as the resistance component of FET Q2 is infinity in control circuit 8, the radio signal from the radio signal receiving portion is applied to one input terminal of the mixing circuit with the level of the radio signal unchanged. On the other hand, as the resistance component of FET Q3 is zero in control circuit 18, the level of the microphone signal from volume adjuster 16 is divided in accordance with the ratio of resistances of resistor R11 and variable resistor VR2 and the divided voltage level is applied to the other input terminal of mixing circuit 24. In other words, the microphone signal is attenuated. Thus, in the signal composed by mixing circuit 24, the radio signal dominates in the quiet environment.

Then, when the level of the sound received by microphone 10 is above the aforementioned given level, the outputs of comparator COMP and transistor Q1 invert to "High" and "Low" levels, respectively, to make the drain-source resistances of FETs Q2 and Q3 zero and infinity respectively. Accordingly, as the resistance component of FET Q2 is zero in control circuit 8, the level of the radio signal is divided in accordance with the ratio of the resistances of resistor R10 and variable resistor VR2. On the other hand, as the resistance component of FET Q3 is infinity, the level of the microphone signal is kept unchanged. Thus, in the signal of the two audio signals mixed by mixing circuit 24, the microphone signal dominates. When variable resistor VR2 is adjusted to change its resistance, a desired ratio of voltage division may be obtained. In case the resistance of variable resistor VR2 is set to a low value, the level of the divided voltage of the voltage divider will be low, causing one of the audio signals to be significantly reduced, so that the other of the audio signals is emphasized. In contrast thereto, in case the resistance of the variable resistor VR2 is set to a high value, the level of the divided voltage will be high to attenuate the emphasis of one of the audio signals. It will be apparent to those skilled in the art that although variable resistor VR2 is employed for the adjustment of the ratio of the voltage division previously in the manufacturing or assembling process, a variable resistor may be employed instead to be adjusted by the user. Further, the ratio of the mixture of the two audio signals is automatically determined by the ratio of the voltage division in each control circuit, or the ratio of the resistances of resistors R12 and R13 in mixing circuit 24 in the aforesaid embodiment. Instead, the ratio of the mixture may be adjusted to a desired value by the manual operation of volume adjuster 16 to change the level of the microphone signal. It will be apparent to those skilled in the art that volume adjuster 16 coupled to the output of the microphone may instead be coupled with the output of the radio.

Figure 3:
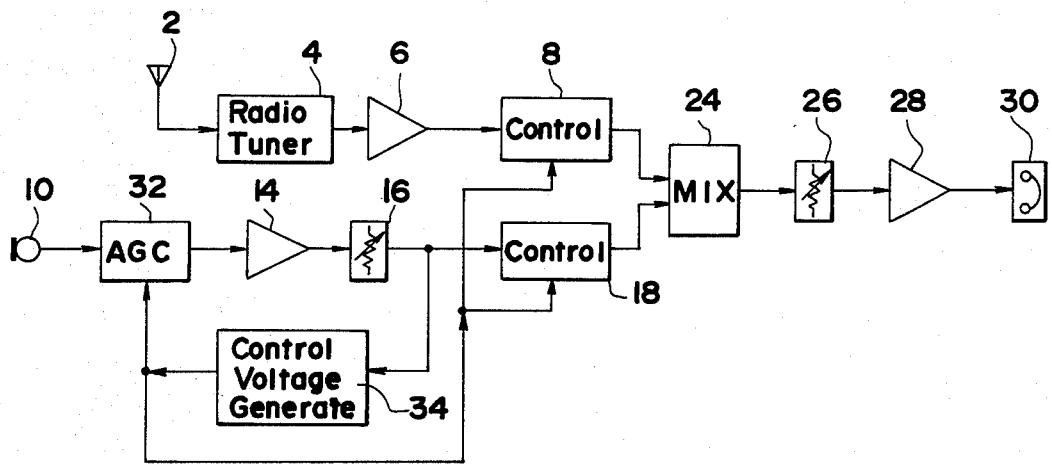
FIG. 3 is a block diagram showing the general construction of another embodiment of the invention.

FIG. 3 is a block diagram showing the general construction of a built-in radio/hearing aid according to another embodiment of the present invention. In the second embodiment, the construction of the automatic gain control circuit and the input signal to the control voltage generator circuit are different from those of the first embodiment and the rest is the same. In the second embodiment, the output signal of microphone 10 is supplied through automatic gain control circuit 32, amplifier 14 and volume adjuster 16 to control voltage generator circuit 34 as well as to control circuit 18. Additionally, the control voltage generated from control voltage generator circuit 34 is fed back to automatic gain control circuit 32 and also applied to control circuits 8 and 18 as in the first embodiment. Automatic gain control circuit 32 is arranged to amplify or attenuate the microphone signal to a desired level when the level of the sound received by the microphone is excessively low or high and to proportionally amplify the microphone signal at a given gain when the sound level is moderate. Accordingly, the level of the microphone signal output from volume adjuster 16 generally corresponds to the level of the sound received by microphone 10, so that control voltage generating circuit 34 generates a control voltage of a level commensurate with the microphone signal. The construction of the remaining portions of the second embodiment may be the same as that of the corresponding portions of the first embodiment and therefore the explanation thereof is not repeated.

In the above embodiments, the control circuits are respectively coupled with both outputs of a radio circuit and a microphone circuit to change the ratio of the mixture by attenuating either one of the output levels in accordance with the level of the microphone signal. Instead, the ratio of the mixture may be changed similarly by an arrangement wherein a control circuit is coupled with either one of the outputs and the output level of the control circuit is adjusted in accordance with the level of the microphone signal.

Further, in the above-described embodiments, a control voltage varies between a "High" or a "Low" level in accordance with whether the level of the sound received by the microphone is above or below a given level, and the control voltage automatically selects either radio signal-dominating or microphone-dominating compound signals. Instead, the circuit may be modified such that the level of the control voltage varies gradually in response to the change of the sound level to gradually change the ratio of the mixture of the radio signal and the microphone signal.

As many apparently widely differing embodiments of this invention may be made without departing from the concept and scope thereof, it is to be understood that the invention is not limited to the specific embodiments thereof except as defined in the appended claims.

What is claimed is:

1. A built-in radio/hearing aid, comprising:
   a microphone for generating microphone signals;
   a radio signal generator for generating radio signals;
   a control voltage generator means for generating a control voltage level corresponding to the level of the microphone signal;
   a control means responsive to said microphone and radio signals for controlling the relative levels of the microphone signal and the radio signal in accordance with the level of the control voltage from said control voltage generator means such that the microphone signal is emphasized and the radio signal is relatively weakened as the control voltage level increases and vice-versa, said control means providing the level controlled microphone signal and the level controlled radio signal at an output thereof; and
   a mixing means for mixing the level controlled microphone signal and the level controlled radio signal from said control means and outputting a mixed signal.

2. A radio/hearing aid according to claim 1 wherein said control voltage generator means includes a reference level generator for generating a reference level and a switching comparator for comparing the level of the microphone signal with the reference level from said reference level generator and switching the level of its voltage output when the level of the microphone signal exceeds the reference level.

3. A radio/hearing aid according to claim 3 wherein said control means includes a microphone level control means for controlling the level of the microphone signal in accordance with the level of the control voltage, and a radio level control means for controlling the level of the radio signal in accordance with the level of the control voltage.

4. A radio/hearing aid according to claim 3 wherein said microphone level control means and said radio level control means respectively include a variable resistance element where resistance is varied in accordance with the level of the control voltage.

5. A radio/hearing aid according to claim 4 wherein said variable resistance element includes a Field Effect Transistor.

6. A radio/hearing aid according to claim 4 wherein said microphone level control means and radio level control means include in common a variable resistor directly connected to said respective variable resistance elements.

7. A radio/hearing aid according to claim 6 wherein said variable resistor is manually adjustable.

* * * * *